US008900884B2

(12) United States Patent
Kula et al.

(10) Patent No.: US 8,900,884 B2
(45) Date of Patent: Dec. 2, 2014

(54) MTJ ELEMENT FOR STT MRAM

(75) Inventors: Witold Kula, Sunnyvale, CA (US);
Ru-Ying Tong, Los Gatos, CA (US);
Guenole Jan, San Jose, CA (US);
Yu-Jen Wang, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 97 days.

(21) Appl. No.: 13/525,502

(22) Filed: Jun. 18, 2012

(65) Prior Publication Data

US 2013/0334629 A1    Dec. 19, 2013

(51) Int. Cl.
*H01L 21/00* (2006.01)
*H01L 29/82* (2006.01)

(52) U.S. Cl.
USPC ............................................ 438/3; 257/421

(58) Field of Classification Search
USPC ...................... 438/3; 257/421–427
See application file for complete search history.

(56) References Cited

U.S. PATENT DOCUMENTS

| | | | |
|---|---|---|---|
| 5,648,885 A | 7/1997 | Nishioka et al. | |
| 5,738,927 A | 4/1998 | Nakamura et al. | |
| 6,411,476 B1 * | 6/2002 | Lin et al. | 360/324.11 |
| 6,452,763 B1 * | 9/2002 | Gill | 360/324.11 |
| 6,828,897 B1 * | 12/2004 | Nepela | 338/32 R |
| 7,570,463 B2 | 8/2009 | Parkin | |
| 7,829,963 B2 | 11/2010 | Wang et al. | |
| 7,916,433 B2 | 3/2011 | Huai et al. | |
| 8,064,244 B2 | 11/2011 | Zhang et al. | |
| 8,138,561 B2 | 3/2012 | Horng et al. | |
| 8,183,652 B2 | 5/2012 | Ranjan et al. | |
| 8,184,411 B2 | 5/2012 | Zhang et al. | |
| 2001/0043986 A1 * | 11/2001 | Saito et al. | 427/130 |
| 2003/0202375 A1 * | 10/2003 | Sharma et al. | 365/158 |
| 2006/0141640 A1 * | 6/2006 | Huai et al. | 438/3 |
| 2008/0316657 A1 * | 12/2008 | Zhang et al. | 360/324.11 |
| 2009/0108383 A1 | 4/2009 | Horng et al. | |
| 2009/0257151 A1 * | 10/2009 | Zhang et al. | 360/324.2 |
| 2011/0076785 A1 | 3/2011 | Xiao et al. | |
| 2011/0163402 A1 | 7/2011 | Fukami et al. | |
| 2011/0268992 A1 | 11/2011 | Zhang et al. | |
| 2012/0146167 A1 | 6/2012 | Huai et al. | |

OTHER PUBLICATIONS

PCT Search Report PCT/US13/36853 Mailed: Jun. 28, 2013, Headway Technologies, Inc.
"Magnetic Tunnel Junctions for Spintronic Memories and Beyond," by Shoji Ikeda et al., IEEE Transactions on Electron Devices, vol. 54, No. 5, May 2007, pp. 991-1002.

\* cited by examiner

*Primary Examiner* — Karen Kusumakar
(74) *Attorney, Agent, or Firm* — Saile Ackerman LLC; Stephen B. Ackerman

(57) ABSTRACT

An all (111) MTJ stack is disclosed in which there are no transitions between different crystalline orientations when going from layer to layer. This is accomplished by providing strongly (111)-textured layers immediately below the MgO tunnel barrier to induce a (111) orientation therein.

25 Claims, 2 Drawing Sheets

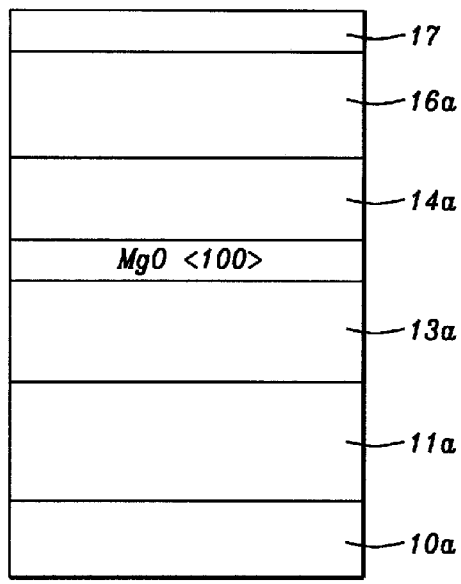
FIG. 1a - Prior Art
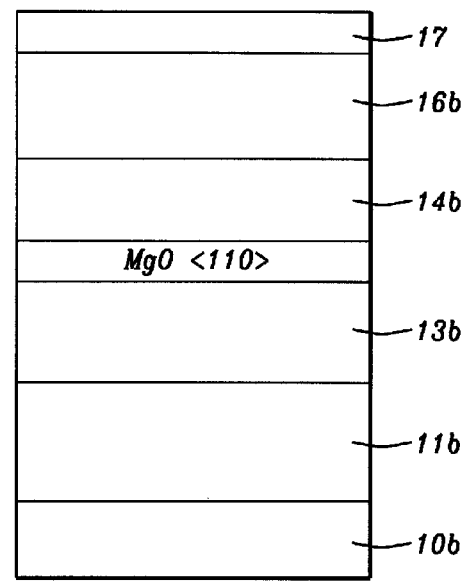
FIG. 1b - Prior Art
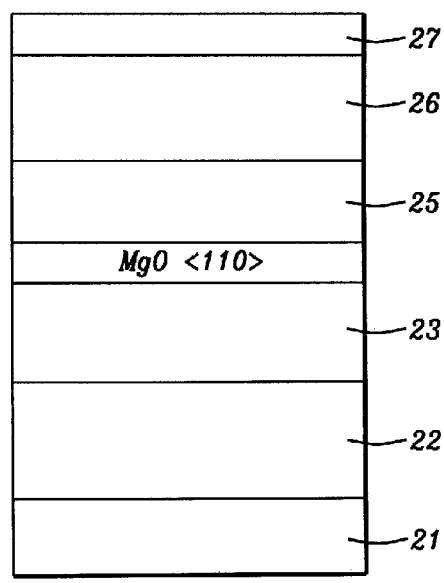
FIG. 2

MTJ ELEMENT FOR STT MRAM

TECHNICAL FIELD

The disclosed device relates to the use of Perpendicular Magnetic Anisotropy (PMA) in Magnetic Tunnel Junction (MTJ) elements in a Spin Transfer Torque (STT) Magnetic Random Access Memory (MRAM).

BACKGROUND

In current practice PMA STT MRAMs, magnetizations of both the MTJ Free Layer (FL) and the Reference Layer (RL) are perpendicular to the plane of MTJ layers and switch between low-resistivity parallel (Rp) and high-resistivity antiparallel (Rap) states which represent logical "0" and "1," respectively. To effect proper writing operations, the PMA of the FL should be high enough to provide thermal stability for data retention while also being low enough to permit STT switching, and the PMA of the RL should be higher than that of FL—high enough to keep the magnetization of RL fixed and protected from STT disturbance or switching.

For exercising a proper reading operation, the resistance difference between the two memory states, expressed as the MTJ Magneto-resistance Ratio (MR=(Rap−Rp)/Rp), should be high enough to provide sufficient readback signal. It is therefore important that MTJ elements combine strong well-controlled PMA with high MR.

The MTJ elements disclosed to date have utilized a (100) oriented MgO layer as the tunnel barrier, since (100) is the orientation that MgO naturally assumes during deposition/oxidation. This MgO layer is then in contact, at both top and bottom, with ferromagnetic layers that, during the subsequent annealing step, will adopt the crystalline orientation of the MgO layer.

A commonly used configuration is [amorphous CoFeB]/MgO/[amorphous CoFeB]. Upon annealing, crystallization progresses from the MgO interfaces, transforming the structure to crystalline [bcc (100) CoFeB]/(100) MgO/[bcc (100) CoFeB] which is then used to effect the MTJ MR device.

Although such a system may possess some PMA due to interfacial anisotropy between MgO and CoFeB, it is necessary to enhance such PMA by adding some bulk PMA materials and/or multilayers. However, the best choices for enhancing the PMA (such as [Pt/Co(Fe)], [Pd/Co(Fe)], [Ni/Co] magnetic layers) "prefer" a fcc (111) crystal orientation which, unfortunately, is incompatible with the bcc (100) orientation induced by the MgO.

As a result, although their detailed materials selections may vary, state of the art MTJ elements are variations of the following two general structures (in which the FL can be either above or below the MgO layer) which are illustrated in FIGS. 1a and 1b:

Shown in FIG. 1a is: Bottom layer(s) 10a//fcc (111) PMA layer 11a//bcc (100) MR layer 13a//(100) MgO/[bcc (100) MR layer 14a//fcc (111) PMA layer 16a/Cap layer 17. Note that an optional transitional layer between layers 14a and 16a is not shown.

Shown in FIG. 1b is: Bottom layer(s) 10b//fcc (111) PMA layer 11b//bcc (100) MR layer 13b//(110) MgO/[bcc (111) MR layer 14b//fcc (111) PMA layer 16b/Cap layer 17. Note that an optional transitional layer between layers 14b and 16b is not shown.

In that, in these structures as a matter of design choice, the FL can be either above or below the MgO layer, the FL and RL can be either simple or Synthetic Antiferromagnetic (SAF) layers, and an additional magnetic Dipole Layer (DL) could be added above or below that stack to improve the symmetry of FL switching.

Some of the layers in FIGS. 1a or 1b may be present, or not, and some materials selections may be different (e.g., L10 ordered phase PMA material instead of fcc (111) PMA), but one important feature remains common:

In at least in one place in the structure, below or above the MgO or both, there is a transition between two different and incompatible crystalline orientations. This mismatch leads to several drawbacks in current practice MTJs as follows:

(a) if the "fcc (111) PMA layer" to "bcc (100) MR layer" transition is part of the bottom layers (i.e. below the MgO as shown in FIG. 1a), neither the (111) nor (100) textures can fully develop at their interface, and the PMA of the PMA layer and the MR of the MR layer are both weakened;

(b) introduction of a transitional layer to mitigate drawback (a) is of only limited help, since the transitional layer decouples the PMA layer from the MR layer making it more difficult for the MR layer to remain in PMA mode; and (c) if the "fcc (111) PMA layer" to "bcc (100) MR layer" transition appears in the top layers (i.e., above the MgO as also shown in FIG. 1a), the situation is even worse due to lack of proper seeding for the "fcc (111) PMA layer" (the role played by "underlayer" in the bottom layers' case) makes it very difficult to grow the PMA layer on top of the MR layer. This is in addition to drawbacks (a) and (b) above, which still apply. All these drawbacks are absent from the device that will be disclosed below.

SUMMARY

It has been an object of at least one embodiment of the present disclosed device to eliminate all transitions between two different and incompatible crystalline orientations at all internal interfaces of a MTJ structure.

Another object of at least one embodiment of the present disclosed device has been to achieve the foregoing object without the introduction of transitional layers to mitigate the negative effects of a transition between two different crystalline orientations.

Still another object of at least one embodiment of the present disclosed device has been to ensure that the layer on which the magnesia tunnel barrier layer is deposited has the correct crystal orientation for it to serve as a proper seed.

A further object of at least one embodiment of the present disclosed device has been to provide a process for achieving the foregoing objects.

These objects have been achieved by the utilization of a single (111) crystalline orientation for all active layers i.e. the PMA layers, MR layers, and the MgO tunnel barrier layer. This is as opposed to current practice MTJs in which the (111) PMA layers are combined with the (100) MR layers and the (100) MgO tunnel barrier, which results in deteriorated crystalline growth and magnetic performance of both the (111) and (100) layers.

BRIEF DESCRIPTION OF THE DRAWINGS

FIG. 1a shows an MTJ of the current practice in which the MgO layer has a 100 orientation. Note that an optional transitional layer between layers 14a and 16a is not shown.

FIG. 1b shows an MTJ of the current practice in which the MgO layer has a 110 orientation. Note that an optional transitional layer between layers 14a and 16a is not shown.

FIG. 2 shows the general layer structure of the disclosed device.

DETAILED DESCRIPTION

Figure 3:
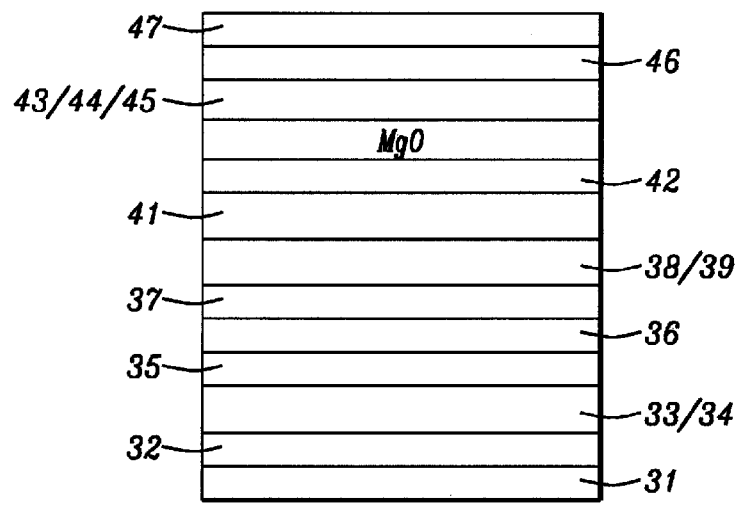
FIG. 3 shows of the detailed layer structure of one implementation of the disclosed device.

The structure that is disclosed below is an all (111) MTJ stack, in which there are no transitions between different crystalline orientations since all PMA layers, MR layers, and the MgO tunnel barrier have the same (111) crystalline orientation. This is accomplished by providing strongly (111)-textured layers immediately below the MgO layer which induce a (111) orientation therein. This is in contrast to the current methodology of growing the MgO on an amorphous template and allowing the MgO's (100) orientation to progress from there into the MR layers.

The general layer structure of the disclosed device is illustrated in FIG. 2 as follows:

(111) seed layer(s) 21/[fcc (111) PMA layer 22]/[fcc (111) MR layer 23]/(111) MgO/[fcc (111) MR layer 25]/[fcc (111) PMA layer 26]/Cap layer 27

In this structure, as a matter of design choice, the FL can be either above or below the MgO layer, the FL and RL can either be simple or Synthetic Antiferromagnetic (SAF) structures. An additional ferromagnetic layer to serve as a Dipole Layer (DL) may be added above or below the MTJ stack to improve the symmetry of FL switching. Depending on the particular implementation, some of the layers shown in FIG. 2 may or may not be present, and/or a single layer that serves both PMA and MR purposes may replace separate PMA and MR layers.

The disclosed MTJ eliminates the drawbacks of current practice MTJ devices listed earlier. In particular, it enables the growth of fully crystallized and properly oriented PMA and MR layers both below and above the MgO tunnel barrier, thereby benefiting both the magnetic design as well as writing and reading performance of the PMA STT MRAM devices.

Examples of Some Specific Structures:

Referring now to FIG. 3, the following is an example of the detailed layer structure of one implementation of the disclosed device (layers listed starting from the bottom).

Ta 31 50 Å/NiCr 32 50 Å/[Co 33 2.5 Å/Ni 34 6 Å]×7/ Co 35 4 Å/Ru 36 4 Å/Co 37 4 Å/[Co 38 2.5 Å/Ni 39 6 Å]×6/Co 41 2. Å/NiFe 42 6 Å/MgO 11 Å/NiFe 43 6 Å/[Co 44 2.5 Å/Ni 45 6 Å]×6/NiCr 46 50 Å/Ru 47 50 Å

Additional Comments:

NiCr underlayer 32 induces a strong (111) texture in the [Co/Ni] PMA multilayer 33-35 that is grown on it. The entire [Co/Ni]/Ru/[Co/Ni] SAF structure (33-41) has a strong (111) orientation and functions as the (111) PMA layer for the RL. The fcc (111) NiFe layer on top of "the (111) PMA layer is the actual RL. This compound (111) RL induces a (111) texture in the MgO tunnel barrier. Fcc (111) NiFe 43, on top of the MgO, is the actual FL while the (111) [Co/Ni] PMA multilayer 44 is the "(111) PMA layer" of the FL.

Figure 4:
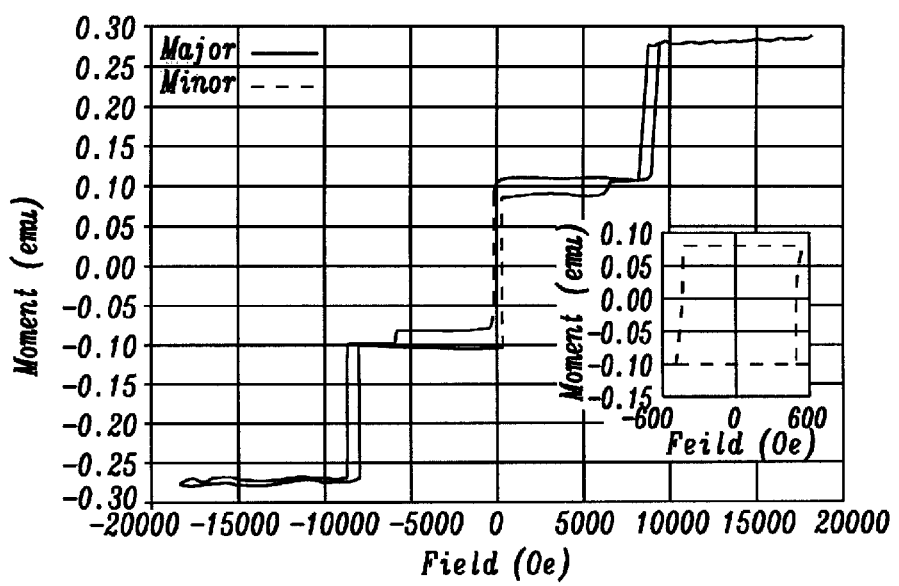
FIG. 4 shows general magnetization curves for the disclosed structure.

The structure was annealed at 300° C. for 10 min. Magnetic properties of the annealed structure were measured with the VSM both in the "in-plane" and "out-of-plane" field configurations, as shown in FIG. 4. Both the RL and the FL of the disclosed MTJ exhibit strong PMA properties.

It is important to note that if the (111) NiFe layers adjacent to MgO had been replaced by amorphous CoFeB layers (as in the current practice), the PMA in the top [Co/Ni] multilayer would have been lost. This is because the CoFeB/MgO/CoFeB part of the structure recrystallizes upon anneal into the (100) orientation, no longer providing a suitable template for the [Co/Ni] multilayer to grow on in the (111) orientation preferred for the PMA.

Magnetization curves for the structure detailed above are shown In FIG. 4. Both the major loop (continuous line) and the minor loop (broken line) were measured. The major loop shows that the magnetization of the entire structure is in the perpendicular direction while the minor loop shows the switching of the free layer occurs only with full remanence in the perpendicular direction at zero applied field.

It should be noted that any of many possible variations in the design and materials of the MTJs could be used while still remaining within the scope and spirit of the disclosed device. Examples include, but are not limited to:

In the design, (a) the FL and RL can either be above or below the MgO, (b) the FL and/or RL can be either simple layer(s) or SAF layers, (c) an additional magnetic DL can be added below or above the stack, and (d) the dedicated MR layer(s) can be eliminated if the PMA layer(s) provide sufficient (111) texture and the desired MR.

For the materials, (a) the [Co/Ni] multilayer can be replaced by [Co(Fe)/Ni(Fe)], [Co(Fe)/Pd], [Co(Fe)/Pt] or similar multilayers, (b) the fcc NiFe MR layer(s) can be replaced by fcc CoFe or CoNiFe that have the right compositions for the fcc phase, and (c) the NiCr underlayer and/or cap can be replaced by other (111) seeding materials such as, but not limited to, Pt, Pd, Cu, Rh, and Ir.

In particular, for the foregoing structure some may prefer to replace the NiFe layers adjacent to the MgO with fcc CoFe (e.g., $CoFe_{10}$) because of the higher MR provided by CoFe relative to NiFe.

Additional Benefits Provided by the Disclosed Device Include:

(i) the FL thickness, PMA strength, and Eb for data retention can be easily adjusted/increased, since the FL PMA derives from the 'bulk' PMA distributed throughout the FL thickness (e.g., that of the [Co/Ni] multilayer) rather than the interfacial PMA generated only at the top and/or bottom FL interface(s);

(ii) similar benefits apply to the MTJ RL; and (iii) a simplified set of materials can be used without degrading the MTJ properties, thereby making the structure more robust against high-temperature processing, including the 400° C. integration process.

What is claimed is:

1. A process for manufacturing a magnetic tunnel junction (MTJ) device comprising:

depositing a seed layer having a (111) crystalline orientation;

depositing on said seed layer a first perpendicular magnetic anisotropy (PMA) layer comprised of a stack of laminated layers wherein a first metal or alloy layer alternates with a second metal or alloy layer, the first PMA layer has a fcc crystal lattice structure and a (111) crystalline orientation;

depositing on said first PMA layer a first magneto-resistive (MR) layer that comprises a NiFe, CoFe, or CoFeNi layer having a fcc crystal lattice structure and a (111) crystalline orientation;

depositing on said first MR layer a tunnel barrier layer of magnesia;

depositing on said magnesia layer a second MR layer having a fcc crystal lattice structure and a (111) crystalline orientation;

depositing on said second MR layer a second PMA layer having a fcc crystal lattice structure and a (111) crystalline orientation;

depositing a capping layer on said a second PMA layer; and then annealing all layers thereby causing said magnesia tunnel barrier layer to assume a (111) crystalline orientation whereby there are no transitions between different crystalline orientations for all active layers of said MTJ.

2. The process recited in claim 1 wherein said first and second PMA layers are selected from the group consisting of Co/Ni, Co/Pd, Co/Pt, Fe/Pd, Fe/Pt multilayers, or any combination thereof and are deposited to a thickness of between about 10 and 150 angstroms.

3. The process recited in claim 1 wherein said first MR layer serves as a free layer for said MTJ and said second MR layer serves as a reference layer for said MTJ.

4. The process recited in claim 3 wherein the step of depositing said second MR layer further comprises:

depositing a first ferromagnetic layer(FL) on said magnesia layer;

depositing an antiparallel coupling layer on said first FL; and depositing a second FL on said antiparallel coupling layer, thereby forming a synthetic antiferromagnetic structure.

5. The process recited in claim 1 wherein said first MR layer serves as a reference layer for said MTJ and said second MR layer serves as a free layer for said MTJ.

6. The process recited in claim 5 wherein the step of depositing said first MR layer further comprises:

depositing a first ferromagnetic layer(FL) on said on said first PMA layer;

depositing an antiparallel coupling layer on said first FL; and depositing a second FL on said antiparallel coupling layer, thereby forming a synthetic antiferromagnetic structure.

7. The process recited in claim 1 further comprising deposition of an additional magnetic Dipole Layer (DL) between said seed layer and said first PMA layer thereby improving FL switching symmetry.

8. The process recited in claim 1 further comprising deposition of an additional magnetic Dipole Layer (DL) between said second PMA layer and said capping layer thereby improving FL switching symmetry.

9. The process recited in claim 1 wherein the step of annealing all layers further comprises heating at about 300° C. for about 10 minutes.

10. The process recited in claim 1 wherein said first PMA layer is comprised of a Ru coupling layer.

11. A process for manufacturing a magnetic tunnel junction (MTJ) device comprising:

depositing a Ta layer;

depositing on said Ta layer a first NiCr layer having a natural (111) crystalline orientation;

depositing on said first NiCr layer about 7 bilayers of Ni on Co, thereby forming a first perpendicular magnetic anisotropy (PMA) layer;

depositing on said first PMA layer a first layer of Co depositing on said first layer of Co a layer of Ru:

depositing on said layer of Ru a second layer of Co, thereby forming a synthetic antiferromagnetic structure;

depositing on said synthetic antiferromagnetic structure about 6 bilayers of Ni on Co thereby forming a reference layer;

then depositing on said reference layer a tunnel barrier layer of magnesia;

depositing on said magnesia tunnel barrier layer about 6 trilayers of Ni on Co on NiFe, thereby forming a free layer;

depositing on said free layer a second layer of NiCr;

depositing on said second layer of NiCr a capping layer of Ru; and then annealing all layers thereby causing said magnesia tunnel barrier layer to assume a (111) crystalline orientation whereby there are no transitions between different crystalline orientations for all active layers of said MTJ.

12. A method to form a magnetic tunnel junction (MTJ) comprising:

depositing a first (111)-oriented magnetic layer (M1) that contacts a top surface of a seed layer that consists of NiCr, Pd, Pt, Cu, Rh, or Ir, and wherein M1 exhibits perpendicular magnetic anisotropy (PMA);

depositing a (111) oriented magnesia (MgO) layer; and depositing a second (111)-oriented magnetic layer (M2) which exhibits PMA to provide a stack of layers with a seed layer/M1/MgO/M2 configuration.

13. The method of claim 12 wherein said first (111)-oriented magnetic layer is a reference layer and said second (111)-oriented magnetic layer is a free layer.

14. The method of claim 12 wherein said first (111)-oriented magnetic layer is a free layer and said second (111)-oriented magnetic layer is a reference layer.

15. The method of claim 12 further comprising annealing said MTJ at about 300° C. for about 10 minutes.

16. A magnetic tunnel junction (MTJ) device comprising:

a seed layer having a (111) crystalline orientation;

on said seed layer, a first perpendicular magnetic anisotropy (PMA) layer having a fcc crystal lattice structure and a (111) crystalline orientation, the first PMA layer is a laminated stack of layers wherein a first metal or alloy layer alternates with a second metal or alloy layer;

on said first PMA layer, a first magneto-resistive (MR) layer that is NiFe, CoFe, or CoFeNi having a fcc crystal lattice structure and a (111) crystalline orientation;

on said first. MR layer, a tunnel barrier layer of magnesia;

on said magnesia layer, a second MR layer having a fcc crystal lattice structure and a (111) crystalline orientation;

on said second MR layer, a second PMA layer having a fcc crystal lattice structure and a (111) crystalline orientation; and a capping layer on said -a second PMA layer, there being no transitions between different crystalline orientations for all active layers of said MTJ.

17. The MTJ device described in claim 16 wherein said first and second PMA layers are selected from the group consisting of Co/Ni, Co/Pd, Co/Pt, Fe/Pd, Fe/Pt multilayers, or any combination thereof and are deposited to a thickness of between about 10 and 150 angstroms.

18. The MTJ device described in claim 16 wherein said first MR layer serves as a free layer for said MTJ and said second MR layer serves as a reference layer for said MTJ.

19. The MTJ device described in claim 16 wherein said first MR layer serves as a reference layer for said MTJ and said second MR layer serves as a free layer for said MTJ.

20. The MTJ device described in claim 16 wherein there is an additional magnetic Dipole Layer between said seed layer and said first PMA layer to improve FL switching symmetry.

21. The MTJ device described in claim 16 wherein there is an additional magnetic Dipole Layer between said second PMA layer and said capping layer to improve FL switching symmetry.

22. The MTJ device described in claim 16 wherein said first PMA layer also includes a Ru coupling layer.

23. A magnetic tunnel junction (MTJ) comprising:
a seed layer consisting of NiCr, Pd, Pt, Cu, Rh and Ir;
a first (111)-oriented magnetic layer (M1) that contacts a top surface of the seed layer and exhibits perpendicular magnetic anisotropy (PMA);
a (111) oriented magnesia (MgO) layer; and
a second (111)-oriented magnetic layer (M2) which exhibits PMA to provide a seed layer/M1/MgO/M2 configuration .

24. The MTJ described in claim 23 wherein said first (111)-oriented magnetic layer is a reference layer and said second (111)-oriented magnetic layer is a free layer.

25. The MTJ described in claim 23 wherein said first (111)-oriented magnetic layer is a free layer and said second (111)-oriented magnetic layer is a reference layer.

* * * * *